United States Patent
Hearn et al.

(10) Patent No.: US 11,441,384 B2
(45) Date of Patent: *Sep. 13, 2022

(54) TOOL FOR METAL PLUGGING OR SEALING OF CASING

(71) Applicant: ConocoPhillips Company, Houston, TX (US)

(72) Inventors: David D. Hearn, Houston, TX (US); Casey Hirschmann, Houston, TX (US); Randall S. Shafer, Houston, TX (US); Stewart M. Robertson, Houston, TX (US); Dan Mueller, Houston, TX (US)

(73) Assignee: CONOCOPHILLIPS COMPANY, Houston, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 16/999,802

(22) Filed: Aug. 21, 2020

(65) Prior Publication Data
US 2020/0381403 A1    Dec. 3, 2020

Related U.S. Application Data

(63) Continuation of application No. 15/706,017, filed on Sep. 15, 2017, now Pat. No. 10,297,578.
(Continued)

(51) Int. Cl.
*E21B 33/13* (2006.01)
*E21B 29/10* (2006.01)
(Continued)

(52) U.S. Cl.
CPC .............. *E21B 33/13* (2013.01); *E21B 29/02* (2013.01); *E21B 29/10* (2013.01); *E21B 33/12* (2013.01);
(Continued)

(58) Field of Classification Search
CPC .......... E21B 33/12; E21B 33/13; E21B 29/02; E21B 29/10
See application file for complete search history.

(56) References Cited

U.S. PATENT DOCUMENTS 2,286,075 A * 6/1942 Evans .................. E21B 36/008
166/58
3,618,639 A * 11/1971 Daley ................. E21B 33/1243
138/97
(Continued)

FOREIGN PATENT DOCUMENTS

WO    2011151271    12/2011
WO    2012001342 A2    1/2012
(Continued)

OTHER PUBLICATIONS

International Search Report, PCT/US2017/051851 dated Dec. 5, 2017; 3 pgs.
Office Action for U.S. Appl. No. 17/075,897, dated Mar. 2, 2022.

*Primary Examiner* — Christopher J Sebesta
(74) *Attorney, Agent, or Firm* — Boulware & Valoir; Tamsen Valoir

(57) ABSTRACT

This disclosure describes a device and method of sealing perforations on a well casing inside a subterranean well. The device comprises a generally cylindrical sleeve having an open top and a closed bottom; a heater located inside the sleeve, the heater comprising a thermite mixture; an ignition mechanism that ignites the thermite mixture upon actuation; and a string connected to the heater ignition and detachably engages the sleeve. The method comprises lowering a body of meltable plugging material into the well casing near the perforations; lowering the plugging device into the well casing immediately on top of the body of meltable plugging material; melting the meltable plugging material by igniting the thermite thereby transferring heat to the body of meltable plugging material; forcing the molten plugging material into
(Continued)

the perforations by pushing the plugging tool further downhole; cooling the plugging tool and the plugging material until the plugging material solidifies; disengaging the tubing string from the sleeve and retrieving the tubing string with the heater; and removing the sleeve and bismuth remaining in the well casing, but not in the perforations.

17 Claims, 5 Drawing Sheets

Related U.S. Application Data

(60) Provisional application No. 62/402,802, filed on Sep. 30, 2016.

(51) Int. Cl.
*E21B 29/02* (2006.01)
*H01L 25/065* (2006.01)
*H01L 25/00* (2006.01)
*H01L 27/11556* (2017.01)
*H01L 27/11565* (2017.01)
*H01L 27/1157* (2017.01)
*H01L 27/11573* (2017.01)
*H01L 27/11582* (2017.01)
*E21B 33/12* (2006.01)
*E21B 36/00* (2006.01)
*H01L 23/00* (2006.01)

(52) U.S. Cl.
CPC ........ *E21B 36/008* (2013.01); *H01L 25/0657* (2013.01); *H01L 25/50* (2013.01); *H01L 27/1157* (2013.01); *H01L 27/11556* (2013.01); *H01L 27/11565* (2013.01); *H01L 27/11573* (2013.01); *H01L 27/11582* (2013.01); *H01L 24/05* (2013.01); *H01L 2224/0401* (2013.01)

(56) References Cited

U.S. PATENT DOCUMENTS

| | | | |
|---|---|---|---|
| 3,830,299 | A | 8/1974 | Thomeer |
| 6,474,414 | B1 | 11/2002 | Gonzalez et al. |
| 6,478,088 | B1 | 11/2002 | Hansen |
| 6,664,522 | B2 | 12/2003 | Spencer |
| 6,828,531 | B2 | 12/2004 | Spencer |
| 7,152,657 | B2 | 12/2006 | Bosma et al. |
| 7,290,609 | B2 | 11/2007 | Wardlaw et al. |
| 9,181,775 | B2 | 11/2015 | Eden |
| 10,738,567 | B2 | 8/2020 | Shafer |
| 2002/0056553 | A1* | 5/2002 | Duhon .................... E21B 36/04 166/302 |
| 2004/0040710 | A1 | 3/2004 | Eden et al. |
| 2005/0109511 | A1 | 5/2005 | Spencer |
| 2006/0037748 | A1* | 2/2006 | Wardlaw ............... E21B 36/008 166/277 |
| 2006/0144591 | A1* | 7/2006 | Gonzalez ............... E21B 33/13 166/277 |
| 2008/0047708 | A1 | 2/2008 | Spencer |
| 2009/0301337 | A1 | 12/2009 | Wilson et al. |
| 2010/0155085 | A1 | 6/2010 | Spencer |
| 2010/0268489 | A1 | 10/2010 | Lie et al. |
| 2011/0167795 | A1 | 7/2011 | Gangopadhyay et al. |
| 2011/0188346 | A1* | 8/2011 | Hull ...................... E21B 47/107 367/35 |
| 2011/0209871 | A1* | 9/2011 | Le ......................... E21B 43/117 166/297 |
| 2011/0220357 | A1 | 9/2011 | Segura |
| 2012/0298359 | A1 | 11/2012 | Eden |
| 2015/0368542 | A1 | 12/2015 | Carragher |
| 2016/0010423 | A1 | 1/2016 | Myhre et al. |
| 2016/0145962 | A1 | 5/2016 | Carragher |
| 2016/0195378 | A1 | 7/2016 | Medina et al. |
| 2017/0145782 | A1 | 5/2017 | Ferg |
| 2017/0350244 | A1 | 12/2017 | Hall et al. |
| 2018/0094504 | A1 | 4/2018 | Hearn et al. |
| 2018/0216437 | A1 | 8/2018 | Shafer |
| 2019/0128092 | A1 | 5/2019 | Mueller et al. |

FOREIGN PATENT DOCUMENTS

| | | |
|---|---|---|
| WO | 2013085621 A1 | 6/2013 |
| WO | 2014096858 | 6/2014 |
| WO | 20140108431 | 7/2014 |
| WO | 2016049424 A1 | 3/2016 |

* cited by examiner

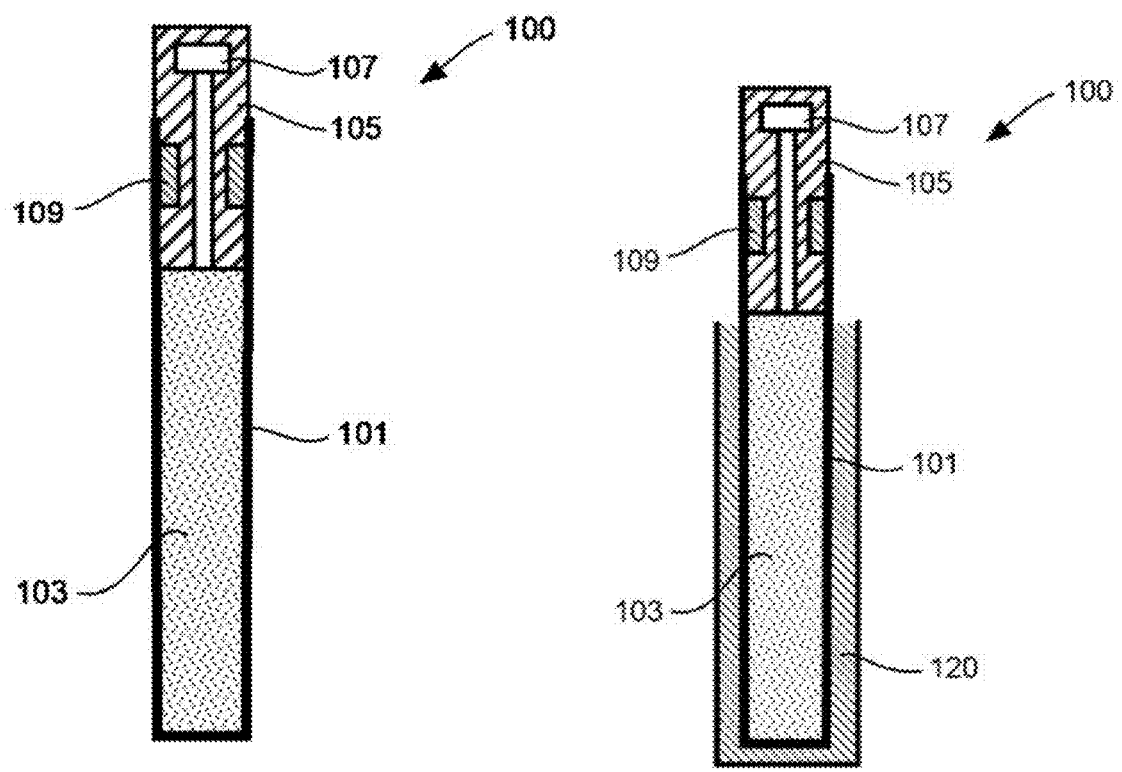

TOOL FOR METAL PLUGGING OR SEALING OF CASING

PRIOR RELATED APPLICATIONS

This application is a Continuation claiming benefit under 35 USC § 120 to U.S. Ser. No. 15/706,071 (now U.S. Pat. No. 10,760,374, granted Sep. 1, 2020), filed Sep. 15, 2017, which is a non-provisional application claiming benefit under 35 USC § 119(e) to U.S. Provisional Application Ser. No. 62/402,802 filed Sep. 30, 2016, entitled "TOOL FOR METAL PLUGGING OR SEALING OF CASING", each of which is incorporated herein by reference in its entirety.

FEDERALLY SPONSORED RESEARCH STATEMENT

Not applicable.

FIELD OF THE DISCLOSURE

The disclosure generally relates to a device and method for sealing casing holes or perforations, particularly to a device and method of using metal plugs to seal subterranean casing holes or perforations.

BACKGROUND OF THE DISCLOSURE

Hydrocarbon wells may be abandoned for a variety of reasons, such as when dry, when no longer economical to produce, or well integrity has been compromised in some way. It is common practice to plug the well before abandoning it, e.g. to prevent seepage of hydrocarbon product from the well. This can also apply to water injectors, i.e. bores which have been drilled in order to pump water into a reservoir to increase bottom hole pressure.

It is also possible to abandon only part of a well. One cost effective way to enhance production is to permanently abandon the bottom of the well, but use the existing slot to sidetrack the well to reach new payzones. The cost can often be cut in half when sidetracking an existing well instead of drilling a new horizontal well. This process is known as "slot recovery."

Plugging can also be temporary, e.g., to allow for workover, a long shut-in, or for converting an exploratory well to a production well. The Norwegian shelf's competitive position, or NORSOK, standards state that the integrity of materials used for temporary abandonment should be ensured for the planned abandonment period times two.

In oilfield jargon "plug and abandon" or "P&A" refers to preparing a well to be closed permanently (or at least until prices or technology developments warrant reentry). The earliest oil wells were abandoned without any plugging, but the first plugging requirements were enacted by Pennsylvania in the 1890s. However, prior to modern regulations set in the '50s, many wells were abandoned with plugs consisting of brush, wood, paper sacks, linen or any other material that could be pushed into a well to form a basis for the dumping of one or two sacks of cement to "plug" the well. Current procedures are significantly more disciplined, however.

Commonly, plugging may be achieved by injecting a settable substance or medium, e.g. cement, into the well. A well will normally have production perforations, that is to say apertures in a well liner or casing through which hydrocarbon product enters from the rock formation and travels to the surface. During plug and abandonment operations it is common to seal ("squeeze") production perforations with cement or another settable medium, which may then form a permanent barrier to lateral flow across the perforations and in/out of the well.

Other reasons exist to plug or seal a well. For example, one can seal leaks in a well, such as casing leaks. Parts of a well can be shut down for production or fracking, and the production or fracking moved to a different zone. Perforations can also be sealed for water shut off. Thus, there are many reasons for plugging a well or for sealing a casing or a portion thereof.

Usually cement is used for plugging wells or sealing casing, but cement can be less than satisfactory as it has a tendency to mix with drilling mud or other downhole fluids and this can cause early failure if the fluids cause channeling in the cement. Additionally, cement can be difficult to pump through perforations in joints, and the cement plugs may not suffice if the formation is weak. Therefore, in some cases, metal is used in place of cement for plugging and sealing operations.

US20060144591, for example, describes a method and tool for applying a fluid seal in a well structure by putting meltable repair material (e.g., eutectic metals or solder) and then ignite exothermic reactant material to melt the meltable material. The molten mass then flows into the defect and supposedly seal the perforations. However, the disclosed device only uses thermite sporadically, and positioning of the device and plugging material are not customizable or accurate enough to reduce the overall operation cost and time. The device fails to be efficiently retrieved and reused, especially when the wells need repeat treatment if not sealed conforming to legal requirements.

Another heater tool that uses thermite is commercially available from BiSN Oil Tools, and described in WO2011151271 and WO2014096858. The BiSN Wel-lok M2M Bridge Plug™ can run on standard wireline, slick line or coil tubing. It uses a bismuth-based alloy that is melted in situ using a chemical reaction (thermite) heater. However, this tool can only heat a small volume of alloy at a time. Thus, its applications are limited.

WO2014108431 discloses a method for plugging a hydrocarbon well, including expanding a section of a tubular within the well to contact the casing lining of the well. The expanded sections are then melted to form a plug for the portions to be plugged. However, it is unclear how the molten material would flow horizontally into the holes when there is no support from the bottom to push the molten material up and force it to flow laterally.

U.S. Pat. No. 6,474,414, entitled "Plug For Tubulars" is directed to the use of molten solder for providing a plug in a subterranean well, which may be poured or otherwise applied directly upon a platform for the molten solder in the well.

U.S. Pat. No. 9,181,775, entitled "Sealing method and apparatus" is directed to the use of a mandrel having multiple rings that are spaced apart to allow molten material to solidify between the rings to form a plug. However, this design does not facilitate lateral filling of the molten material in perforations and leaks.

Therefore, there is still the need for a plugging device or tool that is both efficient for plugging and sealing operations by forcing the molten metal plugging material flowing laterally into the perforations and having a ignitor that can be reconditioned and reused.

SUMMARY OF THE DISCLOSURE

The present disclosure describes a plugging device or tool for effectively sealing wells with joint perforations or leaks with metal and retrieving the heater portion of the device after the sealing is completed, thus allowing recondition and reuse of the heater and minimizing the amount of material in the well to remove by milling. The device comprises a generally cylindrical sleeve inside of which is located a heater that comprises thermite that is coupled to and ignitable by an ignition mechanism. The sleeve is detachably engaged to a tubing, wireline, coil tubing or other running string that also connects to the ignition mechanism so that it can be retrieved. See FIG. 1.

In a plugging or sealing a subterranean well (FIG. 2) a blocking device may be deployed first near the bottom section of the section to be sealed (unless that section is already at the bottom of the well), so as to provide a physical support as the starting point of the operation. A body of meltable plugging material is then placed into the well near the perforations or leaks to be sealed, and sits on top of the blocking device. The meltable plugging material can be dropped from the surface and be in the form of pellets, balls, or other shapes. The top of the meltable plugging material can be determined by volumetric measurement or by running a measurement instrument on wireline.

Alternatively, the meltable material can be molded into a solid cylindrical form that surrounds the sleeve, which is attached to the heater/ignitor assembly. When the heater is ignited, the molded alloy oversleeve melts, falling down onto the base plug and provided the metal plug or seal on re-cooling.

The plugging tool described herein is then introduced into the well to sit immediately above or on the meltable plugging material. When ignited, the heater undergoes a redox reaction and transmits heat through the sleeve to the immediately adjacent meltable plugging material. The meltable plugging material begins to melt, and the plugging device descends further down the well through the molten plugging material, thus forcing the plugging material against the well casing by minimizing its axial movement and promoting its lateral movement into the perforations. Thus, the tool can melt several feet worth of plugging material if needed, and has much larger capacity that prior art tools.

In yet another embodiment, the heater is sent down first, and the pellets dropped around the heater.

In the embodiment of the tool with an molded oversleeve of alloy, it is placed on the bottom on the blocking device. The thermite is ignited and the heat melts the material from surrounding the sleeve, thus filling the area to be plugged over the base plug from the bottom up.

Once the thermite is depleted the plugging device and the molten plugging material is allowed to cool down. The molten plugging material solidifies and adheres to the well casing as well as to the sleeve and any reservoir wall it contacts. The sleeve is then disengaged from the heater, which is pulled with the tubing or other string, which is then retrieved to the wellhead along with the ignition mechanism. The sleeve and/or residual plugging material can then be removed by a mill or drill, if desired, and optionally the well is evaluated to determine whether seal is sufficient. If desired, the drilled/milled section can be fully plugged to provide a permanent or temporary plug.

In more detail, the invention includes any one or more of the following embodiment(s), in any combination(s) thereof:

A device sealing perforations or leaks in a well, comprising:
a) a generally cylindrical sleeve having an open top and a closed bottom;
b) a heater located inside the sleeve, the heater comprising a thermite mixture;
c) an ignition mechanism that ignites said thermite mixture upon actuation, said ignition mechanism inside said sleeve and contacting said thermite; and
d) a line detachably connected to said sleeve and connected to said ignition mechanism, such that said sleeve can be detached and left behind when said ignition mechanism is retrieved from a subterranean well.

A system for sealing perforations or leaks in a well casing or tubular in a subterranean well, comprising:
a) a generally cylindrical sleeve having an open top and a closed bottom;
b) a heater located inside the sleeve, the heater comprising a thermite mixture;
c) an ignition mechanism that ignites the thermite mixture upon actuation,
d) a line connected to said ignition mechanism and detachably engaging said sleeve; and
e) a body of meltable plugging material that is either 1) molded over an outside of said sleeve or 2) placed as pellets a zone to be sealed; and
f) a blocking device at or below a bottom end of said zone to be sealed, which can be a well bottom, plug, or other mechanical blocking device, or a non-mechanical blocking device such as a sand plug, sandbag, resin, sand, and the like.

A method for sealing a well casing in a subterranean well, comprising:
a) lowering a blocking device into a well to block a bottom of a zone of a well to be sealed, unless said zone is already blocked with a blocking device;
b) lowering a body of meltable plugging material into said well to rest on said blocking device;
c) lowering a plugging tool into the well casing immediately on top of the body of meltable plugging material, the plugging tool comprising a generally cylindrical sleeve having an open top and a closed bottom, a heater located inside the sleeve, the heater comprising a thermite mixture, an ignition mechanism that ignites the thermite mixture upon actuation, and a line connected to said ignition mechanism and detachably connected to said sleeve;
d) melting the meltable plugging material by igniting the thermite thereby transferring heat to the body of meltable plugging material;
e) cooling the plugging tool and the plugging material until the plugging material solidifies;
f) disengaging said line from said sleeve and retrieving said line with the ignition mechanism; and
g) drilling out or milling out said sleeve.

A method for sealing a well casing in a subterranean well, comprising:
a) lowering a blocking device into a well to block a bottom of a zone of a well to be sealed;
b) lowering a plugging tool into the well casing immediately on top of the blocking device, the plugging tool comprising a generally cylindrical sleeve having an open top and a closed bottom, a heater located inside the sleeve, the heater comprising a thermite mixture, an ignition mechanism that ignites the thermite mixture upon actuation, and a line connected to said ignition mechanism and detachably connected to said sleeve, wherein a meltable plugging material is molded on the outside of the sleeve;
c) melting the meltable plugging material by igniting the thermite thereby transferring heat to the body of meltable plugging material;
d) allowing the plugging tool to descend further downhole to further melt the meltable plugging material;
e) cooling the plugging tool and the plugging material until the plugging material solidifies;
f) disengaging said line from said sleeve and retrieving said line with the ignition mechanism and exhausted thermite residue; and
g) drilling out or milling out said sleeve.

Any device or system or method herein described, wherein said sleeve has an outer diameter (e.g., ¼ inch,½ inch, 1 inch, 1.5 inch) smaller than the inner diameter of the well casing.

Any device or system or method herein described, wherein the thermite is nano-thermite.

Any device or system or method herein described, wherein said ignition/heater mechanism is a drop bar ignition, a pressure ignition, or a wireline ignition.

Any device or system or method herein described, further comprising a meltable plugging material molded around an outside surface of said sleeve.

Any device or system or method herein described, wherein said line is tubing string, wireline, coiled tubing, and the like.

| -continued |
|---|
| Any device or system herein described, further comprising a leak detector selected from an infrared detector, an acoustic energy detector, and a camera. |
| Any device or system or method herein described, wherein the meltable plugging material is an expandable bismuth alloy. |
| Any method herein described, further comprising, after drilling/milling step: evaluating the sealed section of the well casing to determine whether sealing is complete. |
| Any method herein described, further comprising, after lowering the plugging tool step: determining the optimal location to place the plugging tool by detecting the actual leakage on the well casing. |
| Any method herein described, further comprising the step of plugging the sleeve with a meltable alloy, resin, cement or other material. |
| Any method herein described, further comprising drilling out or milling out the sleeve, and plugging the remaining volume with a meltable alloy, resin, cement or other material. |

As used herein, a "P&A" refers to plug and abandon. Regulations require that the plugs be of sufficient quality to be"permanent," never allowing formation fluids to leak. However, it is recognized that even a permanently plugged and abandoned well may be reopened at a later time for various reasons. Therefore, "permanent" does not imply that the well will not be reopened, but instead refers to the quality of the plug—it needing the potential to last along time.

As used herein, "sealing" a casing or production tubular stops the casing or tubular from leaking, e.g., transfer of fluid from outside the casing to the inside and vice versa (lateral flow) is prevented. However, fluids may still flow through the interior of the casing or production tubing (longitudinal flow). In contrast, "plugging" refers to permanent or temporary plugging and stops both lateral fluid flow across the casing/tubulars as well as longitudinal fluid flow inside the casing/tubulars, and would be suitable for P&A operations. See e.g., FIG. 3 showing rock-to-rock plugging in both lateral and vertical directions.

As used herein, a "blocking device" is any device used to prevent cement or alloy from falling downhole, e.g., it provides a stable base on which to set e.g., a cast-in-place plug. This can be a mechanical device, such as basket, inflatable basket, plug, packer, or metal plug placed by melting Bismuth alloy or other metal and the like.

The blocking device could also be a cement plug, barite plug, sand plug, resin plug, combinations thereof, a bolus of extra heavy mud, or any other non-mechanical blocking device. Since this only acts as a base for a plug, it is not required to act as a permanent plug by itself, and the requirements may be less stringent.

"Tubular" or "tubing" can be used generically to refer any type of oilfield pipe, such as drill pipe, drill collars, pup joints, casing, production tubing and pipeline. However, generally we have referred to the inner tubing, such as injection tubing or production tubing as tubulars herein. The outer one or more tubing sets, we have referred to as "casing" herein.

As used herein, a "joint" is a length of pipe, usually referring to drill pipe, casing or tubing. While there are different standard lengths, the most common drill pipe joint length is around 30 ft [9 m]. For casing, the most common length of a joint is 40 ft [12 m].

As used herein, a "tubular string" or "tubing string" refers to a number of joints, connected end to end (one at a time) so as to reach down into a well, e.g., a tubing string lowers a sucker rod pump to the fluid level.

As used herein the "wellhead" refers to the surface termination of a wellbore that incorporates facilities for installing casing hangers during the well construction phase. The wellhead also incorporates a means of hanging the production tubing and installing the Christmas tree and surface flow-control facilities in preparation for the production phase of the well.

As used herein, "thermite" means a pyrotechnic composition of metal powder fuel and metal oxide. When ignited by heat, thermite undergoes an exothermic reduction-oxidation (redox) reaction. Examples of the metal in thermite compositions include but not limited to aluminum, magnesium, titanium, zinc, silicon, and boron. Examples of the oxidizers in termite compositions include but not limited to bismuth (III) oxide, boron (III) oxide, silicon (IV) oxide, chromium (III) oxide, manganese (IV) oxide, iron (III) oxide, iron (II, III) oxide, copper (II) oxide, and lead (II, IV) oxide.

The use of the word "a" or "an" when used in conjunction with the term "comprising" in the claims or the specification means one or more than one, unless the context dictates otherwise.

The term "about" means the stated value plus or minus the margin of error of measurement or plus or minus 10% if no method of measurement is indicated.

The use of the term "or" in the claims is used to mean "and/or" unless explicitly indicated to refer to alternatives only or if the alternatives are mutually exclusive.

The terms "comprise", "have", "include" and "contain" (and their variants) are open-ended linking verbs and allow the addition of other elements when used in a claim.

The phrase "consisting of" is closed, and excludes all additional elements.

The phrase "consisting essentially of" excludes additional material elements, but allows the inclusions of non-material elements that do not substantially change the nature of the invention.

The following abbreviations are used herein:

| ABBREVIATION | TERM |
|---|---|
| P&A | Plugging and abandoning |

BRIEF DESCRIPTION OF THE DRAWINGS

FIG. 1A shows the tool of this disclosure.

FIG. 1B shows the tool having a meltable material molded over it, forming a cylindrical oversleeve, surrounding the sleeve.

DETAILED DESCRIPTION

Figure 2A:
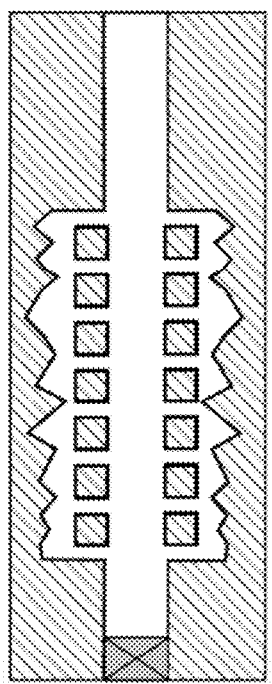
FIG. 2A-I shows the method using the tool of this disclosure.

FIG. 1A shows the novel tool of this disclosure. The tool is designed for efficient sealing of perforations or leaks in the well casing or production tubulars in subterranean wells. The device 100 comprises a cylindrical sleeve 101 with a closed bottom or base inside which thermite 103 is located. The thermite 103 is coupled to an ignition mechanism 107, also inside the sleeve 101 so as to ignite the thermite 103 and start the exothermic reaction.

When the alloy melts, it will have a consistency like water, and fill all gaps between the sleeve and reservoir wall, thus filling any perforations. If an expandable alloy is used, it will continue to expands as it cools, being pushed radially into good connection or bond with the reservoir wall. Any small gaps between the base plug and the wall are easily filled by the cooling alloy front, thus filling such gaps, and very little is lost to leakage.

The sleeve and heater can be 1 to 10 m or more in length and holds 25 to 500 pounds of thermite mixes of various thermite concentrations, thus having the heat capacity to melt up to 50-2000 pounds of alloy. When fully deployed, the abandonment plug ranges from 1-10 meters in length, and this great length has sufficient integrity to provide a permanent abandonment plug or seal holes and/or perforations allowing other operations after cleaning the wellbore out through the section. For larger bore plugs, or for longer lengths of perforations, the plug can be set in stages, adding one or more layers on top of the initial plug.

The sleeve 101 and the thermite heater 103 are detachably connected to a running tool that is attached to a work string 105 and can be released by triggering a release mechanism 109. The running tool can also be attached to a wireline, a coil tubing, or a running string tubing or drill pipe or other work string. The release mechanism 109 can be a shear release. Thus, the sleeve can be left downhole, and the workstring 105 can retrieve the ignition element 107. The string 105 connects to the retrieving equipment, wireline, coil tubing or drilling unit so that the igniter 107 and heater 103 can be retrieved. Thus, when detached, the ignitor, and any remaining heater or thermite product will be pulled from the hole, leaving a sealed casing behind, lined with the sleeve, which is bonded to the alloy.

The sleeve is made of a strong material that has longitudinal strength and good heat/chemical resistance to be used in the subterranean environment. Further, the sleeve preferably has thin walls that are easily drillable for lighter weight, and for easily removable by a mill or drill upon completion of plugging. In one embodiment, the sleeve is made of thin metal of about ⅛" inches of steel. Thus, if desired, it can easily be removed, leaving a clean casing for further downhole work, or it can then be further plugged with additional alloy or other materials. Alternatively, the sleeve can be further plugged, with melted alloy or other material.

The heat generated by the thermite is controlled, for example, by its composition that is designed for a particular material and length of time, such that the sleeve and other parts of the system would not be melted. Also in most cases thermodynamics inside the well will remove excess heat from the sleeve, preventing it from being melted.

The exterior diameter of the plugging tool 100 is such that it can loosely slide inside the well casing and allow for a small gap between the inner surface of the casing and the outer surface of the tool. The gap is to reduce undesirable wear and tear when lowering the tool into the well, to accommodate minor deviations in the tubulars, and also to allow molten plugging material to flow upward when the sleeve physically displaces the molten plugging material inside the well. If the gap is larger, then more plugging material is required. In a preferred embodiment, the gap is about ⅛" to ½", for example, in a 10¾" pipe, the plugging tool can have a diameter of 9¾" to 10½".

In another variation the sleeve has bismuth alloy 120 or other material molded or attached to it in the form of an oversleeve, as shown in FIG. 1B. In this case the sleeve and heater are smaller in diameter. The molded alloy has a thickness to allow for a small gap between the inner surface of the casing and outer surface of the tool.

The ignition mechanism is not limited, as long as the thermite can be properly ignited. Typically, in the metal/metal oxide thermite, the ignition temperature is extremely high. Ignition of a thermite reaction normally requires a sparkler or easily obtainable magnesium ribbon, but may require persistent efforts, as ignition can be unreliable and unpredictable.

The two most common ways to ignite thermite are: magnesium ribbon (Mg) and potassium permanganate ($KMnO_4$)+glycerin. Magnesium metal burns in an oxygen environment (air) in a very bright, exothermic reaction. Magnesium ribbon can burn at several thousand degrees easily igniting thermite. The magnesium ribbon is useful as it acts like a fuse, calmly burning, allowing a short delay between when the ribbon is lit and when the thermite begins to react. Potassium permanganate is an extremely powerful oxidizer which spontaneously ignites after coming in contact with glycerin. After adding a few drops of glycerin to potassium permanganate powder and a short delay, a violent exothermic oxidation reaction occurs which will ignite a thermite mixture.

The ignition mechanism can be a drop bar ignition, a pressure ignition, a wireline ignition, or other suitable mechanism. A drop bar ignites the thermite through its physical impact on a firing head, which burns to a high temperature thus igniting the thermite.

A thermite can also be ignited under high temperature and pressure. By creating a sealed chamber adjacent to the thermite, a sudden increase of pressure by compressing the chamber accompanied by setting off the magnesium ribbon, the thermite can be ignited.

A wireline ignition uses an electrically conductive wireline connecting to a resistive material surrounded by a thermite material, such that when electricity flows through the wireline into the resistive material, which heats up to the ignition point of the thermite material and ignites it.

The running string engages the heater, by connectors (not shown) provided between the heater and the tubing string. The heater is then engaged to the sleeve by friable latches, shear pins, or other removable connectors. The shear force of an attempted withdrawal will break the friable latches, shear pins or other connectors because the sleeve is bonded to the now solidified plugging material, thus resisting withdrawal. This allows the heater to detach from the sleeve, allowing the beater and thermite remnant to be retrieved, leaving the sleeve behind.

FIGS. 2A-I show the method of present disclosure using the tool as shown in FIG. 1.

In FIG. 2A, the subterranean well 230 has a plurality of perforations/holes 232 that need to be plugged before abandoning the well or that need to be sealed for other reasons. The perforations/holes 232 may or may not be interconnected, but herein shown are perforations in an outer casing that is otherwise cemented, thus the perforations reach to or into the reservoir rock and the cement remains between perforations. The bottom of the well zone 230 has been blocked, for example by a blocking device or the bottom of the well, so that the meltable plugging material and the tool can be accurately positioned.

The plugging apparatus and method of this disclosure can be used on exterior perforations as well as leaking casing, so long as the apparatus and the meltable material can fit inside the wells needed to be plugged. Thus, heater sleeve size is adjusted for well diameter.

Figure 2B:
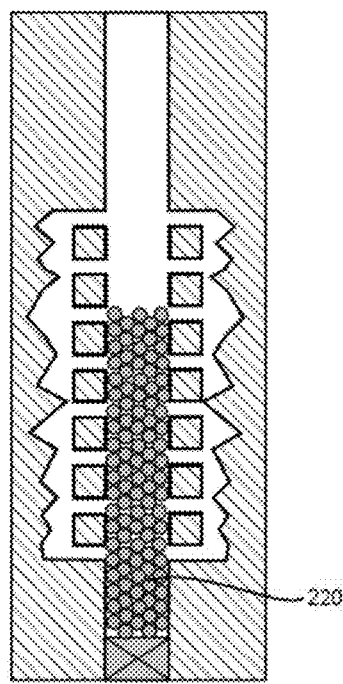

In FIG. 2B, the meltable plugging material 220 is lowered to the portion of well that needs to be sealed or plugged. Here the plugging material 220 is positioned with the help of the blocking device. This material can be dropped from surface in the form of pellets, balls, or other shapes. The top of this material can be determined by running tools on wireline.

The plugging material 220 in this case is preferably a low melt alloy in the form of pellets. Low melt alloys or fusible alloys are alloys with a low melt temperature and that can expand up to 3.32% when solidifying from a liquid to a solid depending on the product. This expansion allows these alloys to precisely conform to any intricate details when molded. In a cast-in-place plug or seal, the expansion means that the plug will expand to firmly contact the reservoir walls, as well as any cement and metal casing or tubing, and provide a tight seal. Further, since the preferred expandable alloys continue to expand as they cool, alloy will be forced into tiny cracks, channels, fractures and the like, providing an excellent barrier.

Bismuth alloys are a preferred cast-in-place material because bismuth expands 1-3.32% on solidification. Bismuth also has unusually low toxicity for a heavy metal. Furthermore, we have tested these alloys and know that the liquid alloy does not mix with other fluids, like cement does. Thus, the channeling common in cement plugs is avoided.

Exemplary alloys are described in U.S. Pat. No. 7,290,609. As a general rule, bismuth alloys of approximately 50% bismuth exhibit little change of volume (1%) during solidification. Alloys containing more than this tend to expand during solidification and those containing less tend to shrink during solidification. Additional alloys are described in US20150368542, which describes a bismuth alloy comprises bismuth and germanium and/or copper. Additional eutectic alloys to plug wells or repair existing plugs in wells are described in U.S. Pat. No. 7,152,657; US20060144591; U.S. Pat. Nos. 6,828,531; 6,664,522; 6,474,414; and US20050109511. Other bismuth alloys can also be used, while bismuth tin or bismuth lead or bismuth aluminum are most common.

Figure 2C:
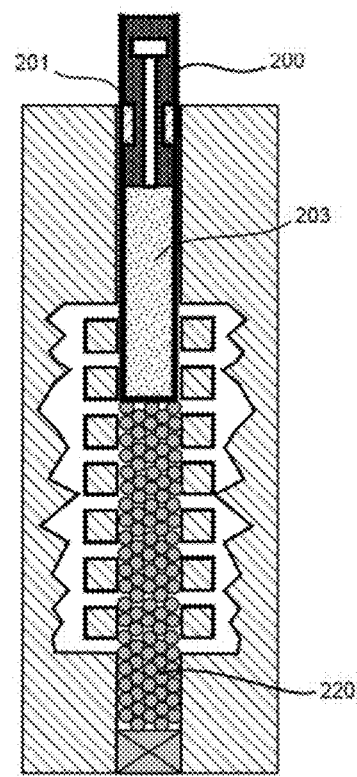

In FIG. 2C, the plugging tool 200 with thermite 203 inside the sleeve 201 is lowered into the portions to be plugged inside the well. The plugging tool 200 is positioned on top of the meltable plugging material. As discussed above, the amount of meltable plugging material can be measured against the well diameter to obtain the exact location of its top. Or alternatively, when previously dropping the meltable plugging material 220, the associated wireline has a known length that can be used to determine where the plugging tool 200 should be positioned.

If preferred, melting can be started from the bottom, by first deploying then tool, and then dropping pellets into the well. This may be beneficial for sealing any annular space at the bottom first.

In the next step, the thermite 203 is ignited by the ignition mechanism in the plugging tool 200. Here the thermite can be a conventional thermite, or Applicant's co-pending nano-thermite. See co-pending US20180094504. Nano-thermite is an especially useful material because it requires less heat to initiate the thermite reduction-oxidation reaction, and the volume of the material can be tuned to each well being plugged. Additionally, the small size of particles increases the amount of surface area for the reaction, which in turn increases the reaction rate and produced heat, thereby allowing the plug to be set quicker than one using conventional thermite.

Once ignited, the exothermic reaction will heat the sleeve and surrounding meltable bismuth alloy previously deposited inside the well, beginning to melt it. The well casing itself is a large heat sink to direct and dissipate the excess heat on the sleeve away, thus preventing the sleeve from being melted. The composition of the thermite can also be tailored for different type and amount of bismuth alloys.

Figure 2D:
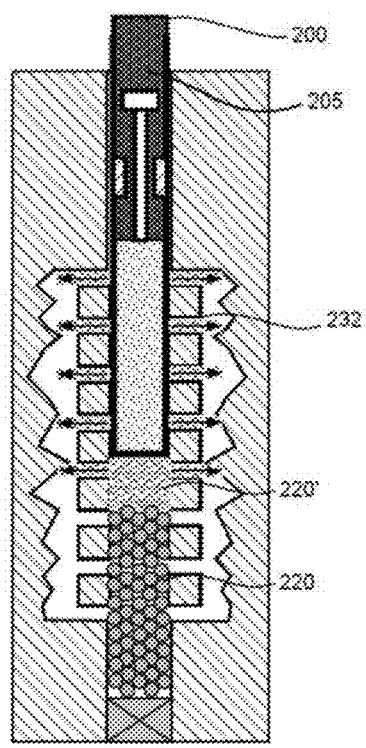

In FIG. 2D, molten bismuth alloy allows the plugging tool 200 to descend further into the well, at the same time the molten bismuth is pushed up along the well and into the perforations. This is important and beneficial, because the physical space occupied by the plugging tool 200 forces the molten bismuth into the perforations instead of into space that is otherwise inaccessible by the prior art tools. The more the bismuth is melted, the further down the plugging tool 200 travels to displace molten bismuth and push it into the perforations. Further, a larger volume of meltable material can be melted using the tool of the invention than with prior art tools.

Figure 2E:
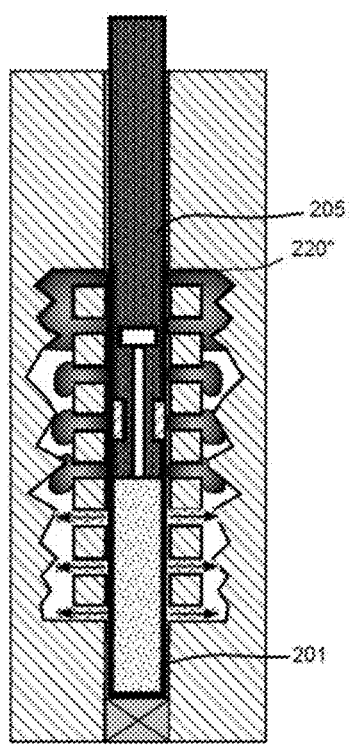

In FIG. 2E, the plugging tool 200 eventually reaches to the bottom of the well (or the blocking device), and at this time all bismuth has been melted, and all perforations are filled with molten bismuth as well. If the casing is not cemented, a small amount will run down the exterior of the casing, but the gap is typically not very large, and the alloy will cool as it leaves the heated zone, coming to a stop. Heated alloy will drip over the cooled zone, itself cooling and building up the solid portion, until it eventually plugs the annulus completely. Where the casing is cemented, the alloy fills the perforations, and any cracks or crumbled cement, as well as fractures in the reservoir wall. As the alloy continues to cool, it will expand and be forced into tight contact with its surroundings, forming a very good seal.

Figure 2F:
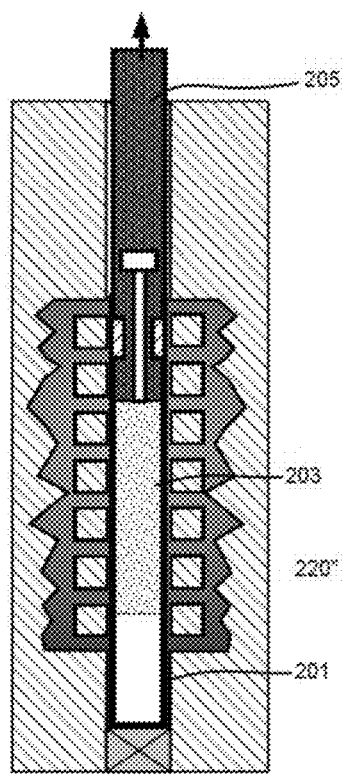

In FIG. 2F, the thermite inside the plugging tool 200 is exhausted, and both the tool and the bismuth alloy are allowed to cool down and solidify. Once the bismuth is solidified, the tool 200 detaches from the sleeve 201 by disengaging the release mechanism (see FIG. 1,109), leaving the sleeve in place while the string 205 pulls the ignitor portion of the tool 200 away, along with the solid exhausted thermite. As noted above, the sleeve release mechanism can be pressure based, thus snapping as the heater is pulled up, or an active release mechanism (e.g. a magnetic or electric latch), can be triggered by wireline.

Leaving the sleeve portion of the tool in place and retrieving just the heater is beneficial. Not only are the heater components retrieved for reuse, allowing the use of more efficient electrical ignitors, but the sleeve reduces the amount of molten alloy needed to seal the casing (or tubular). It also allows much more molten material to be generated than prior art tools, which were completely retrieved, instead of being allowed to penetrate and melt a larger volume of material in a sequential fashion.

Figure 2G:
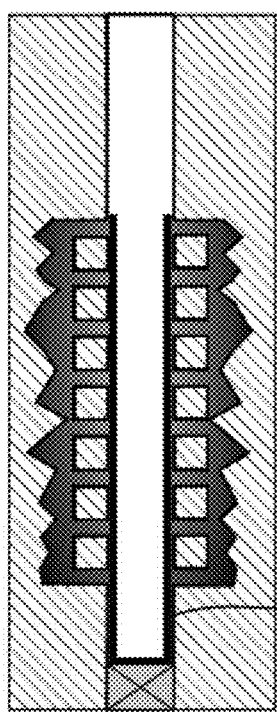

In FIG. 2G, the tool 200 is completely removed from the well, while the sleeve 201 is still held in place by the re-solidified bismuth alloy or other material. The fact that the sleeve 201 is left in place actually facilitates the removal of tool 200. The solid thermite product (after redox reaction) will be retrieved along with the heater.

Figure 2H:
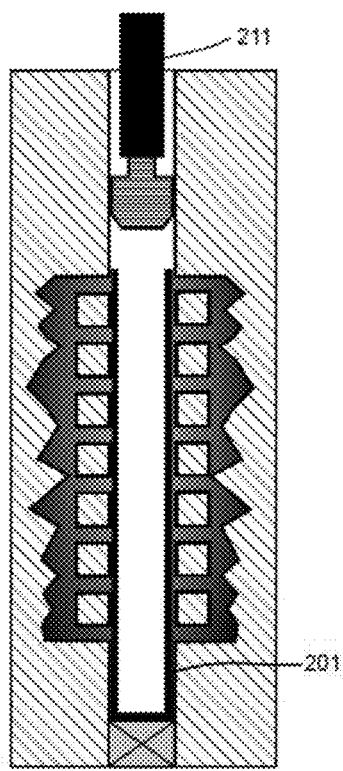
Figure 2I:
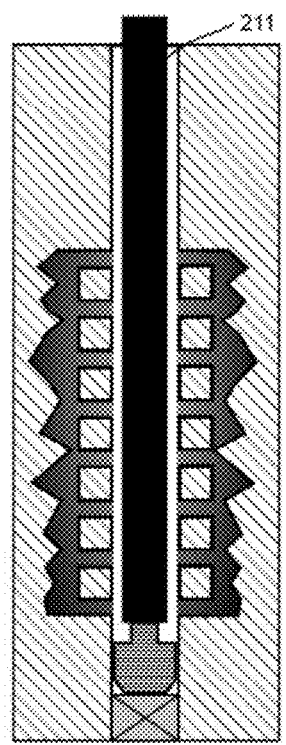
Figure 3:
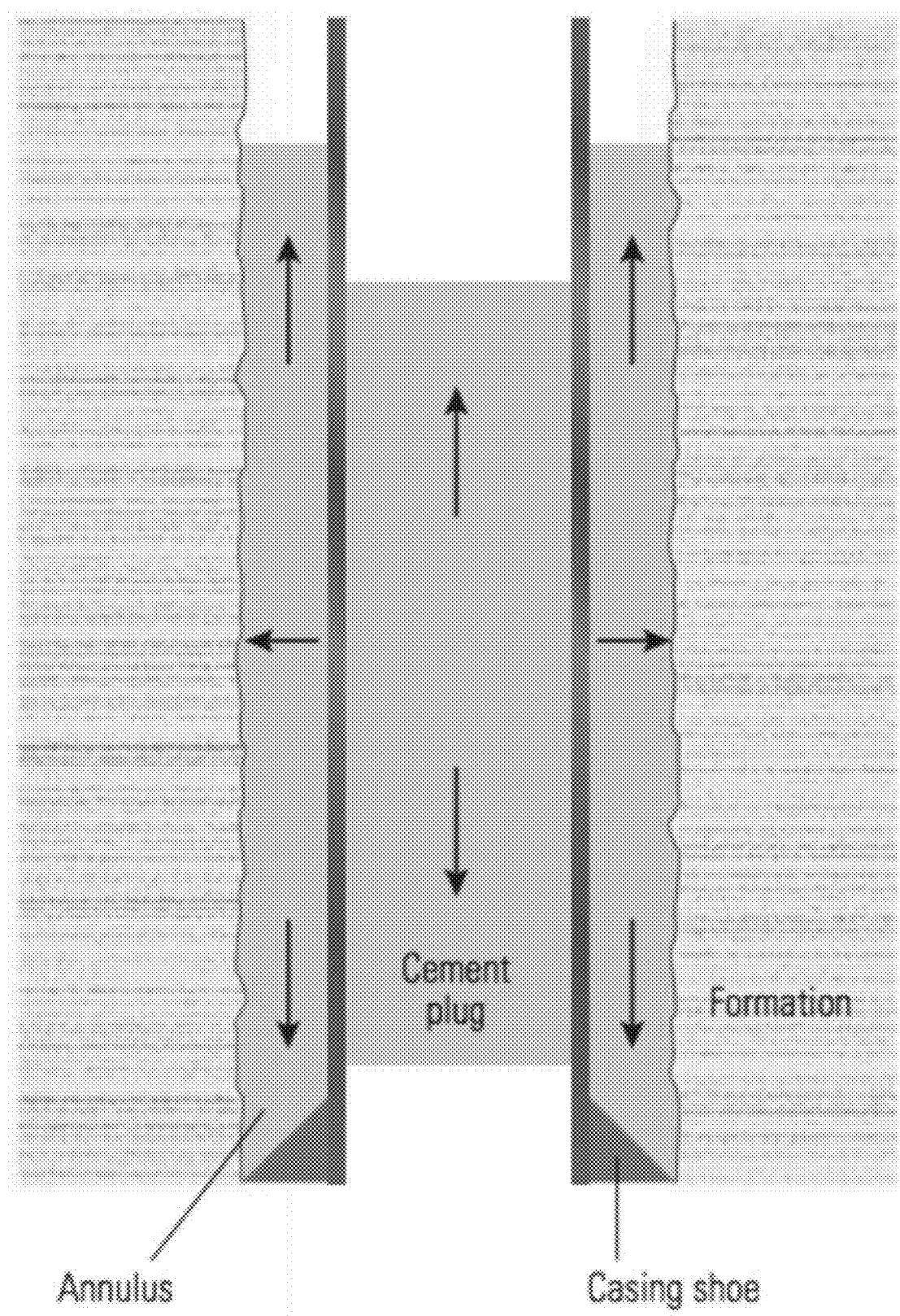
FIG. 3 shows basic plugging.

In FIG. 2H, a mill 211 (or a drill that has appropriate diameter) is introduced inside the well in order to mill and destroy the sleeve 201 and optionally residual bismuth in the gap between the casing interior and sleeve exterior, leaving only the perforations with filled bismuth, which completely plugs the holes, as shown also in FIG. 2I. This provides a sealed casing, with completely smooth interior surface, allowing further downhole work.

If instead of a seal, a permanent plug is desired, then the central milled or drilled region can be further plugged by deploying a blocking device to the base of the area to be plugged, and then the space filled with cement, resin, sandbag, geopolymer, cast-in place bismuth alloy plug, and the like. It may not even be necessary to mill out the sleeve, but leave it in place, depending on the material durability and regulations. Alternatively, a bridge plug can be used, that is e.g., capped with cement. This complete plugging can be done by methods known in the art, or by new methods described for example in US20190128092 and U.S. Ser. No. 10/738,567. Nevertheless, using the methodology employed herein, we have ensured that the original perforations and/or leaks are permanently sealed all the way to the formation wall.

In another embodiment, the bismuth alloy or other metal can be molded onto the outside of the sleeve, forming a second sleeve or "oversleeve". The assembly is run and the bottom tagged. The heater is then ignited and the heat melts the alloy from the heater and into the perforations (or holes). The metal re-solidifies, thereby holding the sleeve in place and facilitates removal of the heater.

Test 1

Applicant tested the plugging tool of this disclosure comparing to existing sealing method. It is discovered that the time for plugging operations is shortened by at least 30%, primarily because the integrated tool removal mechanism and customizable nano-thermite. Further, a larger zone can be sealed that was previously possible with the smaller prior art tools, and the amount of sealing material per unit of well length is reduced.

The following references are incorporated by reference in their entirety.

US20050109511, Oil and gas well alloy squeezing method and apparatus

US20060144591 Method and apparatus for repair of wells utilizing meltable repair materials and exothermic reactants as heating agents US20150368542 Heat sources and alloys for us in downhole applications US20160145962 WO2011151271 WO2014096858 Apparatus for Use in Well Abandonment US20180094504, Nano-thermite Well Plug US20190128092, Through Tubing P&A with Bismuth Alloys U.S. Pat. No. 6,474,414 Plug For Tubulars U.S. Pat. No. 6,474,414 Plug For Tubulars U.S. Pat. No. 6,664,522 Method and apparatus for sealing multiple casings for oil and gas wells U.S. Pat. No. 6,664,522 Method and apparatus for sealing multiple casings for oil and gas wells U.S. Pat. No. 6,828,531 Oil and gas well alloy squeezing method and apparatus U.S. Pat. No. 7,152,657 In-situ casting of well equipment U.S. Pat. No. 7,290,609 Subterranean well secondary plugging tool for repair of a first plug U.S. Pat. No. 9,181,775 Sealing method and apparatus U.S. Ser. No. 10/738,567, Through tubing P and A with two-material plugs WO2014108431 A method for plugging a hydrocarbon well

The invention claimed is:

1. A device for sealing perforations or leaks in a well, comprising:
 a) a generally cylindrical sleeve having sides and an open top and a closed bottom;
 b) a heater located inside said sleeve, said heater comprising a thermite;
 c) an ignition mechanism inside said sleeve and contacting said thermite that upon actuation ignites said thermite; and
 d) a line detachably connected to said sleeve, said line connected to said ignition mechanism, such that said sleeve can be detached and left behind to form a sealed casing with said sleeve exterior bonded to a plugging material when said ignition mechanism is retrieved from a subterranean well.

2. The device of claim 1, wherein said thermite is a nano-thermite.

3. The device of claim 1, wherein said ignition mechanism is a drop bar ignition, a pressure ignition, or a wireline ignition.

4. The device of claim 1, wherein said line comprises a tubing string or wireline or coiled tubing.

5. The device of claim 1, wherein said device further comprises a leak detector selected from an infrared detector, an acoustic energy detector, and a camera.

6. The device of claim 1, wherein said device further comprises a cylindrical oversleeve made of a meltable plugging material molded around an outside surface of said sleeve.

7. The device of claim 6, wherein said meltable plugging material is a eutectic alloy.

8. The device of claim 6, wherein said meltable plugging material is a bismuth alloy.

9. A method for sealing a well casing in a subterranean well, comprising:
 a) lowering a blocking device into a well to block a bottom of a zone of casing having one or more perforation(s), unless said zone is already blocked with a blocking device;
 b) lowering the device of claim 1 into said well to said zone;
 c) lowering a body or pellets of a meltable plugging material to said zone;
 d) actuating said ignition mechanism and igniting said thermite to produce molten plugging material;
 e) cooling said molten plugging material until said molten plugging material solidifies in a space between a wall of said well and an exterior of said sleeve and filling said perforation(s); and
 f) disengaging said line from said sleeve and retrieving said line and said ignition mechanism without retrieving said sleeve, wherein an amount of said meltable plugging material is less than would be required by a method that removes said sleeve.

10. The method of claim 9, further including the step of squeezing said molten plugging material before said cooling step e) to force said molten plugging material into said perforation(s).

11. The method of claim 9, wherein said meltable plugging material is a eutectic alloy.

12. The method of claim 9, further comprising, after step f) evaluating said zone to determine whether said perforation(s) are completely sealed.

13. The method of claim 9, further comprising first determining an optimal location to place said device by detecting a location of said perforation(s).

14. The method of claim 9, further comprising step g) drilling out or milling out said sleeve.

15. A method for sealing a well casing in a subterranean well, comprising:
 a) lowering a blocking device into a well casing to block a bottom of a zone of a well to be sealed, unless said zone is already blocked with a blocking device;

b) lowering the device of claim 6 to said zone;
c) actuating said ignition mechanism and igniting said thermite to melt said oversleeve resulting in molten plugging material;
d) cooling said molten plugging material until said molten plugging material solidifies in a space between a wall of said well and an exterior of said sleeve; and
e) disengaging said line from said sleeve and retrieving said line with the ignition mechanism without retrieving said sleeve, wherein an amount of said meltable plugging material is less than would be required by a method that removes said sleeve.

16. The method of claim 15, further including the step of squeezing said molten plugging material before said cooling step d) to force said molten plugging material into one or more perforation(s) in said zone.

17. The method of claim 15, wherein said meltable plugging material is a eutectic alloy.

* * * * *